United States Patent [19]

Akamatsu et al.

[11] Patent Number: 4,853,880
[45] Date of Patent: Aug. 1, 1989

[54] DEVICE FOR POSITIONING A SEMI-CONDUCTOR WAFER

[75] Inventors: Takahiro Akamatsu, Machida; Hiroshi Nakazato, Ohme; Takashi Matsumura, Yokohama; Kenji Fukui, Kawasaki, all of Japan

[73] Assignee: Canon Kabushiki Kaisha, Tokyo, Japan

[21] Appl. No.: 898,222

[22] Filed: Aug. 20, 1986

[30] Foreign Application Priority Data

Aug. 23, 1985 [JP] Japan ............................. 60-183972
Aug. 23, 1985 [JP] Japan ............................. 60-183975
Oct. 22, 1985 [JP] Japan ............................. 60-234506

[51] Int. Cl.$^4$ .................... G01B 11/00; B65H 9/20
[52] U.S. Cl. .................... 364/559; 198/394; 356/400; 250/557
[58] Field of Search ............... 364/559, 480; 356/150, 356/400, 401; 250/548, 557; 198/394

[56] References Cited

U.S. PATENT DOCUMENTS

| | | | |
|---|---|---|---|
| 3,683,195 | 8/1972 | Johannsmeier et al. | 250/548 |
| 3,890,508 | 6/1975 | Sharp | 250/548 |
| 3,930,684 | 1/1976 | Lasch, Jr. et al. | 198/380 |
| 3,972,424 | 8/1976 | Levy et al. | 198/394 |
| 4,024,944 | 5/1977 | Adams et al. | 198/394 |
| 4,077,579 | 3/1978 | Seleski et al. | 250/548 |
| 4,370,059 | 1/1983 | Masuda | 250/548 |
| 4,457,664 | 7/1984 | Judell et al. | 198/394 |
| 4,466,073 | 8/1984 | Boyan et al. | 364/559 |
| 4,618,292 | 10/1986 | Judge et al. | 198/394 |
| 4,633,419 | 12/1986 | Niiho et al. | 364/559 |
| 4,641,257 | 2/1987 | Ayata | 356/400 |
| 4,685,206 | 8/1987 | Kobayashi et al. | 198/394 |

Primary Examiner—Parshotam S. Lall
Assistant Examiner—S. A. Melnick
Attorney, Agent, or Firm—Fitzpatrick, Cella, Harper & Scinto

[57] ABSTRACT

A device for positioning a disk-like workpiece, the device having a system for detecting a change in position of an edge of the workpiece, the detecting system producing a signal; a system for selecting a portion of the signal produced by said detecting means, which portion contains desired positional information, the selecting means producing a signal; and a positioning system for rotating the workpiece on the basis of the signal produced by the selecting system, to thereby position the workpiece.

4 Claims, 11 Drawing Sheets

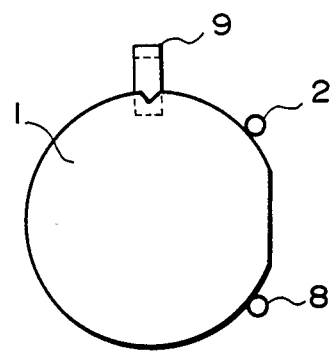
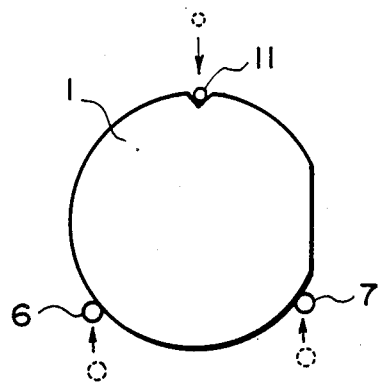
F I G. 2A　　　　F I G. 2D
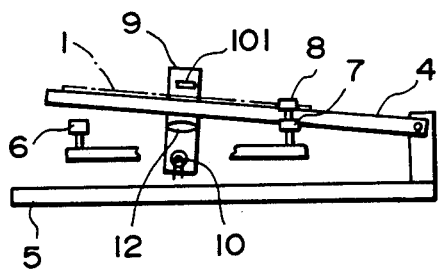
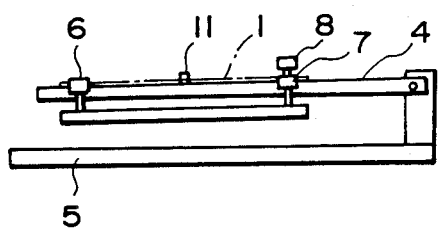
F I G. 2B　　　　F I G. 2E
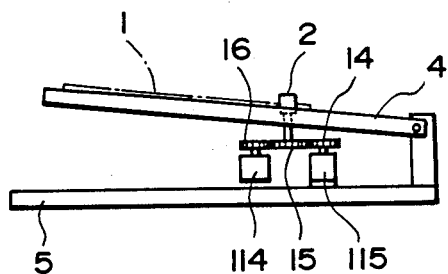
F I G. 2C

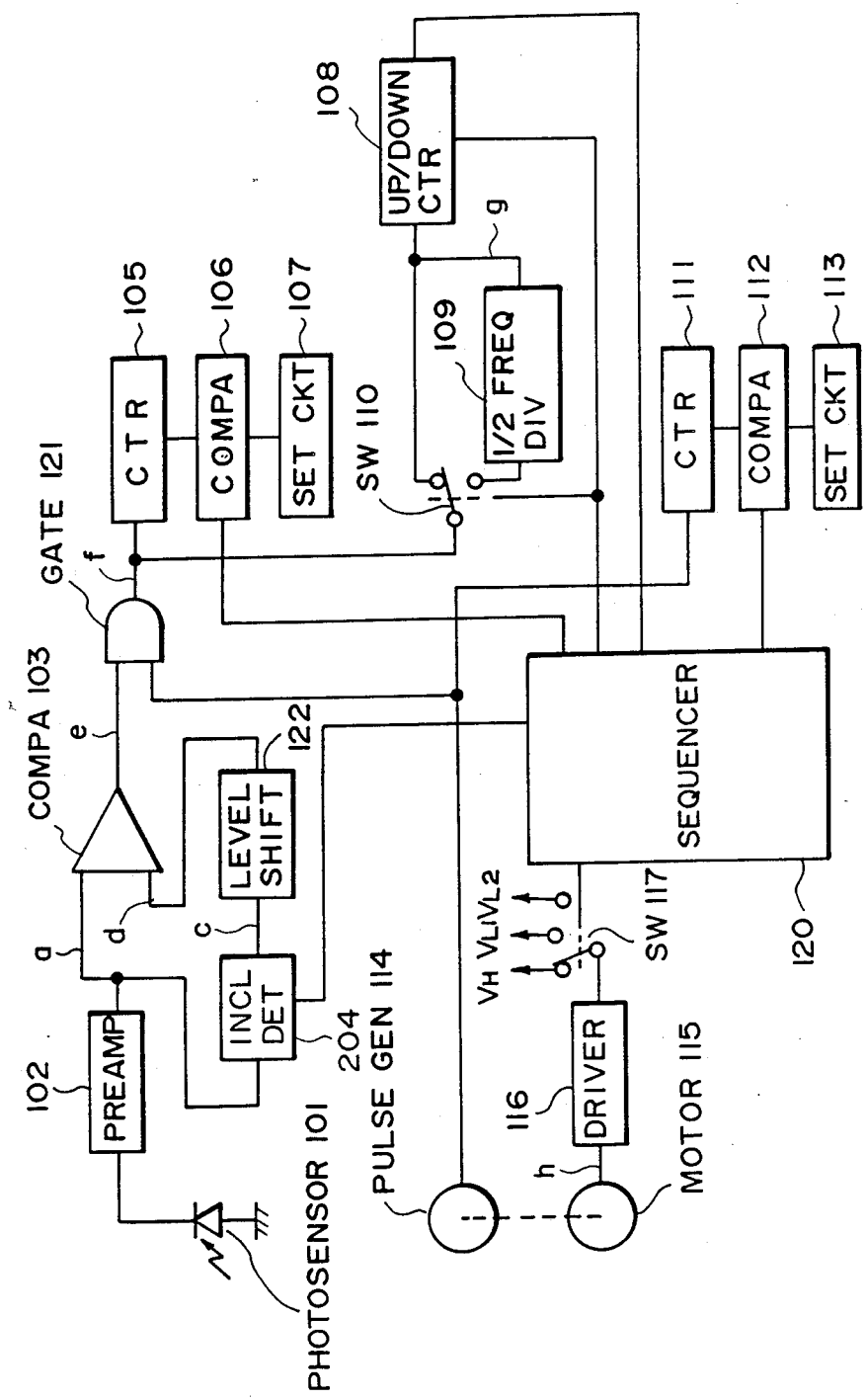
F I G. 6

DEVICE FOR POSITIONING A SEMI-CONDUCTOR WAFER

FIELD OF THE INVENTION AND RELATED ART

This invention relates to a device for positioning a workpiece and, more particularly, to a device for positioning, in a desired orientation, a disk-like workpiece such as a semiconductor wafer having a small cut-out portion. The positioning device of the present invention is particularly suitably usable upon introducing semiconductor wafers into a microcircuit manufacturing exposure apparatus such as a mask aligner, a measuring apparatus or an examining apparatus such as a wafer prober, and so on.

Conventionally, the semiconductor wafers which are to be processed for the manufacture of microcircuits such as integrated circuits, each has a cut-out portion formed in its outer periphery. Such cut-out portion is used for the sake of mechanical positioning of the semiconductor wafer. Usually, the cut-out portion is provided by cutting away a portion of the circular wafer along a rectilinear line extending in parallel to the tangent of the circular periphery of the wafer. Such a cut-out portion is called an "orientation flat".

A positioning device for positioning the wafer by use of the orientation flat is proposed in Japanese Laid-Open Patent Application, Laid-Open No. 18713/1983, entitled "Device for Positioning a Disk-Like Member". According to the proposed device, changes in the wafer edge position are detected with the aid of photoelectric detecting means whose output is differentiated to thereby detect the center of the orientation flat. Then, on the basis of the result of detection, the wafer is positioned. Another example of a positioning device is disclosed in Japanese Laid-Open Patent Application, Laid-Open No. 198642/1982, entitled "Wafter Position Detecting Device". According to this proposal, the wafer edge position is detected with respect to each of different rotational positions of the wafer and the thus detected wafer edge positions are compared with each other, whereby an extreme value on the wafer edge position relative to the change in the rotational position is detected and whereby the wafer position is detected.

Recently, some of the wafers are formed with small V-shaped cut-out portions (hereinafter "notches"). Usually, one wafer is provided with one notch as well as one orientation flat. For this type of semiconductor wafer, the positioning devices of the above-described two examples are not able to discriminate the notch and the orientation flat from each other. As a result, the positioning of the wafer based on the notch is difficult to achieve.

A proposal has been made in an attempt to position a semiconductor wafer having a notch. According to this proposal, a positioning pin having a pair of photosensors disposed at the opposite sides of the pin is provided. The pin is pressed against the wafer and the wafer is rotated. When the pin engages with the notch, the photosensors are intercepted simultaneously by the peripheral portions of the wafer at the opposite sides of the notch, whereby the notch position is detected. In this manner, the wafer positioning is accomplished. The rotational force upon detection of the notch is applied to the wafer from two driving rollers. According to this proposal, however, all of the positioning pin and the driving rollers are pressed against the wafer when it is rotated. As a result, a strong external force is applied to the wafer, which easily results in damage of the wafer. Also, the wafer can not be rotated at a higher speed, which leads to prolongation of the positioning time.

SUMMARY OF THE INVENTION

It is accordingly a first object of the present invention to provide a device for positioning a plate-like workpiece having a small cut-out portion formed at its outer periphery, the device allowing positioning of the workpiece based on the cut-out portion without damaging the workpiece due to the application of an external force and allowing the positioning of the workpiece in a reduced time.

It is a second object of the present invention to provide a device for positioning a plate-like workpiece having a small cut-out portion such as a notch and a relatively large cut-out portion such as an orientation flat, the device allowing correct discrimination of these cut-out portions from each other and allowing accurate positioning of the workpiece based on the small cut-out portion.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 2A–2E schematically shows the manner of positioning according to the first embodiment of the present invention, wherein FIG. 2A is a plan view showing an example of positional relation of driving rollers and a cut-out detecting unit with a workpiece such as a wafer, FIGS. 2B and 2C are side views of the positioning device, FIG. 2D are a plan view showing an example of positional relation of pressing rollers and a positioning pin with the workpiece, and FIG. 2E is a side view of the positioning device which is in a final positioning state.

FIG. 6 is a block diagram of a control system of a positioning device according to a second embodiment of the present invention.

DESCRIPTION OF THE PREFERRED EMBODIMENTS

Figure 1:
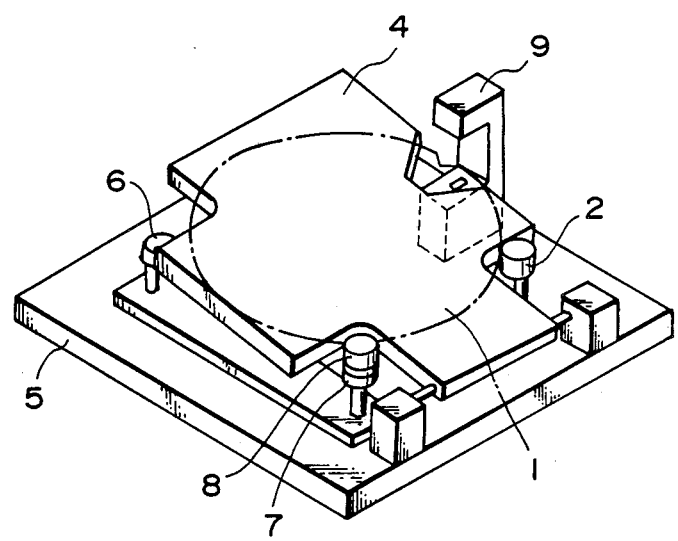
FIG. 1 is a perspective view schematically showing a positioning device according to a first embodiment of the present invention.

Referring first to FIG. 1, there is shown a positioning device according to a first embodiment of the present invention. In FIG. 1, a disk-like workpiece such as a wafer 1 has a V-shaped notch and an orientation flat (not shown) formed at respective preset positions on the outer peripheral portion thereof. The wafer 1 is placed on a wafer supporting table 4. While not shown in the drawings, the table 4 has an air-bearing mechanism for floatingly supporting the wafer 1. Also, the table 4 is tiltable about an axis defined at a side edge thereof. Denoted in this Figure by numeral 2 is a wafer driving roller; by 5, a base for supporting various components of the positioning device; and by 6 and 7, pressing rollers provided to execute final positioning of the wafer 1. The pressing rollers 6 and 7 are mounted on the base 5 for movement. More particularly, each of the pressing rollers 6 and 7 is movable inwardly so as to be pressed against the wafer 1, and also is movable outwardly so as to disengage from the wafer 1. A wafer rotation guide roller 8 is mounted on the top of the pressing roller 7. The wafer rotation guide roller 8 is adapted to engage with the wafer 1 when the table 4 is in its inclined position, thereby to rotatably hold the wafer 1 with the aid of the wafer driving roller 2. Denoted generally at numeral 9 is a cut-out sensor unit which is provided to detect the notch and/or the orientation flat of the wafer 1 and which is disposed at such location with which the notch or the orientation flat of the wafer is to be aligned.

FIGS. 2A–2E are schematic views showing the positioning device of the present embodiment. Of these Figures, FIG. 2A is a schematic plan view. In the state of FIG. 2A, the table 4 is inclined and the notch of the wafer is detected by the sensor unit 9. FIGS. 2B and 2C are schematic side views, respectively, of the positioning device which is in a state corresponding to the FIG. 2A state. Particularly, FIG. 2B illustrates details of the components in the neighborhood of the sensor unit 9, while FIG. 2C illustrates details of components in the neighborhood of the wafer driving roller 2. FIGS. 2D and 2E are a schematic plan view and a schematic side view, respectively, showing the positioning device in a state in which the detection of the notch is accomplished and the table 4 is returned to its horizontal position so that the device is prepared for the final mechanical positioning.

In FIGS. 2A–2E, denoted by numeral 10 is an illumination source; by 11, a pressing pin which functions as a final positioning pin; by 12, a condensing lens system; and by 101, a photoelectric detecting element (hereinafter referred to as "photosensor"). All of these elements are mounted on the sensor unit 9. The sensor unit 9 is movable inwardly and outwardly. More particularly, it is moved inwardly for detection of the notch and/or the orientation flat of the wafer 1 and for engaging the wafer 1 with the positioning pin 11 for the sake of final mechanical positioning. In the other occasions, the notch sensor unit 9 is moved to its outward position.

The illumination source 10 such as a lamp is provided to illuminate, from the underneath, the edge portion (peripheral portion) of the wafer 1. The photosensor 101 is disposed at an upper portion of the sensor unit 9 so as to be opposed to the light source 10. The light from the source 10 is concentrated on the lower surface of the wafer by the condensing lens system 12. In the present embodiment, the lens system 12 is arranged to shape the light, from the source 10, into one having an elongated or slit-like shape in cross-section which elongates on the wafer substantially in a radial direction with respect to the wafer 1. The longitudinal size of the photosensor 101 and the lengthwise size of the concentrated light to be partially incident on the wafer 1 (the lower surface) are determined so as to meet possible changes in the degree of light interception due to any variation in the outer diameter of the wafer and/or the passage of the notch and the orientation flat through the sensor unit 9.

As shown in FIG. 2C, the device includes a pulse generator 114 and a motor 115 which is a component of driving means for rotating the wafer 1. The motor 115 has a rotational shaft on which a gear 14 is mounted. The gear 14 is in meshing engagement with a gear 15 which is mounted on a rotational shaft of the wafer driving roller 2. That is, by actuating the motor 115, the wafer driving roller 2 is rotated. Also, the gear 15 is in meshing engagement with a gear 16 which is mounted on a rotational shaft of the pulse generator 114. Suitable parts are selected as the gears 15 and 16 and the pulse generator 114 such that, for example, one complete revolution of the wafer driving roller 2 causes the pulse generator 114 to produce six hundreds (600) pulses. Accordingly, by counting the pulses produced from the pulse generator 114, the amount of rotation of the wafer driving roller 2 and thus the amount of rotation (angle of rotation) of the wafer 1 are detectable.

Figure 3:
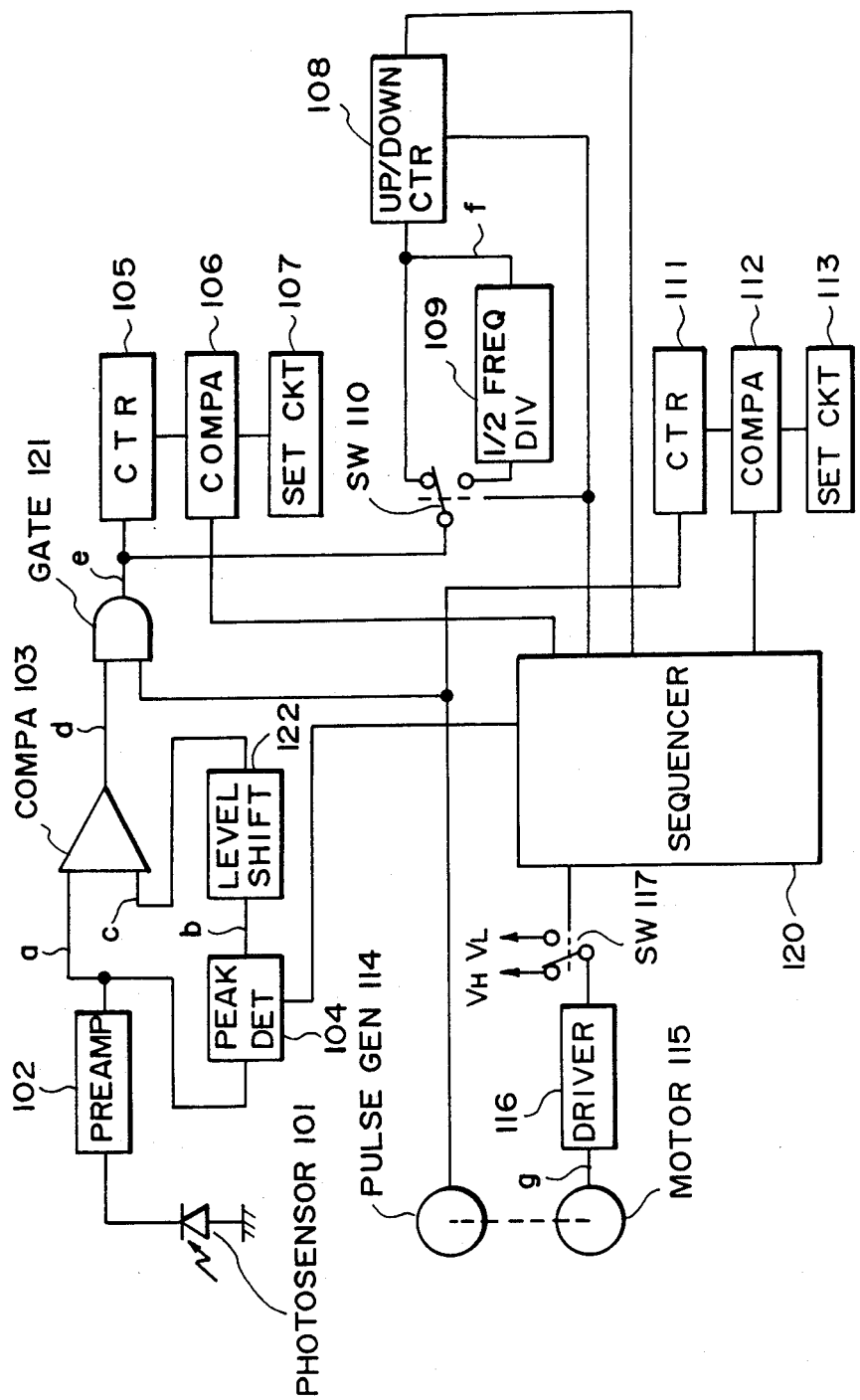
FIG. 3 is a block diagram showing a control system of the positioning device according to the first embodiment of the present invention.
Figure 4:
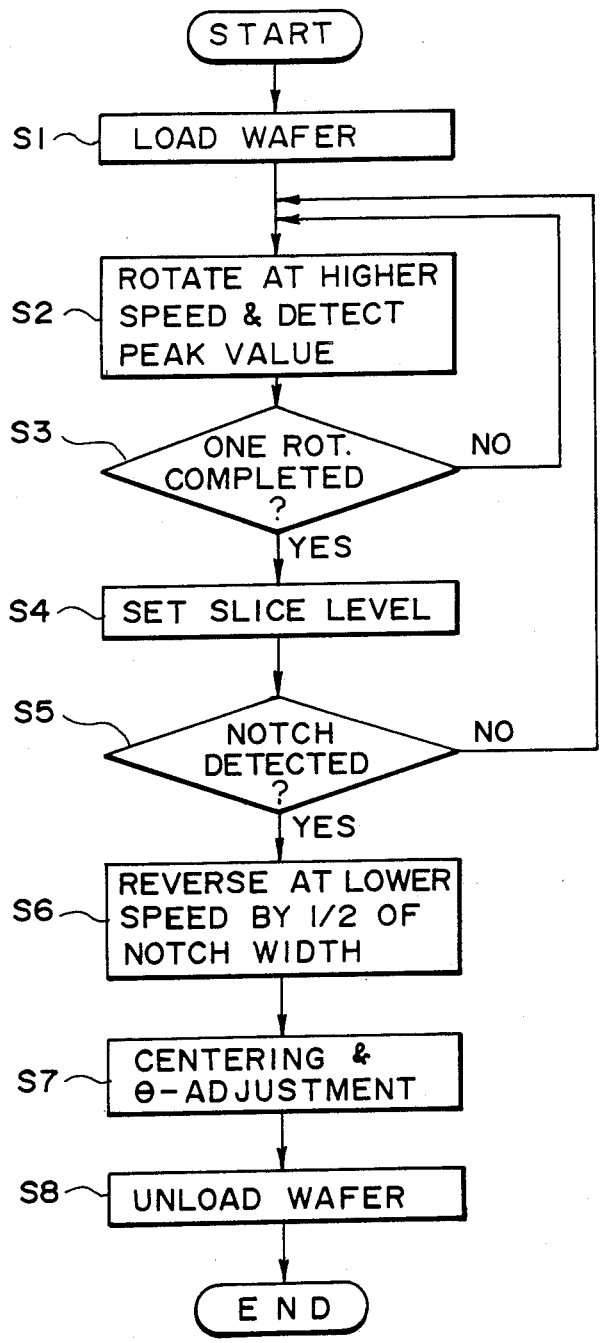
FIG. 4 is a flow chart showing an operational sequence of the positioning device according to the first embodiment of the present invention.

FIG. 3 is a block diagram showing a control system of the positioning device according to the present embodiment. By use of the block diagram of FIG. 3, the functions of portions of the control system upon photoelectric detection of the notch of the wafer will now be described.

In response to reception of light, the photosensor 101 produces an output. The output of the photosensor 101 is amplified by a preamplifier 102. By this, changes in the quantity of incident light as detected by the photosensor 101 are converted into changes in an electric voltage. The output signal from the preamplifier 102 is applied to a peak detecting circuit 104, whereby the peak value of the signal is detected. When it is detected, the peak detecting circuit 104 produces a peak-value signal which is applied to a level shifter 122. The level shifter 122 is adapted to shift down the level of the peak-value signal by a preset suitable amount, and the thus processed peak-value signal is applied to an input terminal of a comparator 103. The comparator 103 has another input terminal to which the output signal from the preamplifier 102 is directly input. Thus, the comparator 103 compares two input signals and produces an output signal which corresponds to the difference in level of the two signals applied to the comparator. The function of the level shifter 122 will be described later in more detail.

The motor 115 produces a driving force for rotating the wafer driving roller 2, and, in the present embodiment, the direction and speed of rotation of the motor 115 (i.e. the direction and speed of rotation of the wafer) can be changed in two phases, i.e. a phase for higher speed forward rotation and a phase for lower speed reverse rotation. Changing the phase of operation of the motor 115 is effected by means of a switch 117. The rotation of the output shaft of the motor 115 is transmitted to the pulse generator 114, so that it produces pulses in accordance with the rotation of the wafer 1.

A counter 105 is provided to detect, in one aspect, the notch of the wafer 1. An AND gate 121 is provided. Under the influence of this AND gate 121, the pulses outputted from the pulse generator 114 are applied to the counter 105, to be counted thereby, only when the output signal of the comparator 103 is in a "high" level. The result of counting by the counter 105 is inputted into a comparator 106. The comparator 106 is adapted to compare the thus inputted result of counting with an upper limit value and a lower limit value which are preset in a setting circuit 107. If the result of counting by the counter 105 is within a range between the upper limit value and the lower limit value set in the setting circuit 107, it is discriminated that the wafer notch, which is the subject of the detection at this time, exists at the wafer edge portion that has just been subjected to the photoelectric detection by the photosensor 101 at the time at which the counting by the counter 105 has been made. And, in such case, the comparator 106 produces a detection signal representing this.

An up/down counter 108 is provided to detect the position of the center of the notch with respect to the peripheral direction of the wafer. The same pulses as those to be inputted into the counter 105 are applied to this up/down counter 108. More particularly, a half frequency divider 109 and switch means such as at 110 are provided. And, under the influence of the switch 110, the pulses are applied directly to the counter 108 in an occasion or those having been processed by the frequency divider 109 are applied to the counter 108 in another occasion. Also, the switching signal for the switch 110 is effective to change the counting mode of the up/down counter 108, i.e. establishing the up-counting mode or the down-counting mode. Namely, in the up-counting mode, the counter 108 counts the pulses applied thereto by way of the divider 109, while in the down-counting mode it counts the pulses directly applied thereto. As will be described later, this is for the purpose of positioning the center of the notch. The up/down counter 108 produces, in its down-counting mode, a carry signal when it counts zero.

A counter 111 is provided to detect one complete rotation of the wafer 1. The counter 111 counts the output pulses from the pulse generator 114. A setting circuit 113 is provided. In this setting circuit 113, such a value that is slightly greater than the number of output pulses from the pulse generator 114 in response to one complete rotation of the wafer 1, is preset. A comparator 112 compares the result of counting by the counter 111 with the set value in the setting circuit 113. If the number of pulses as counted by the counter 111 is not less than the preset value, the comprator 112 produces a detection signal representing completion of one rotation of the wafer 1.

Sequencer 120 is provided to control the system as a whole.

Figure 5:
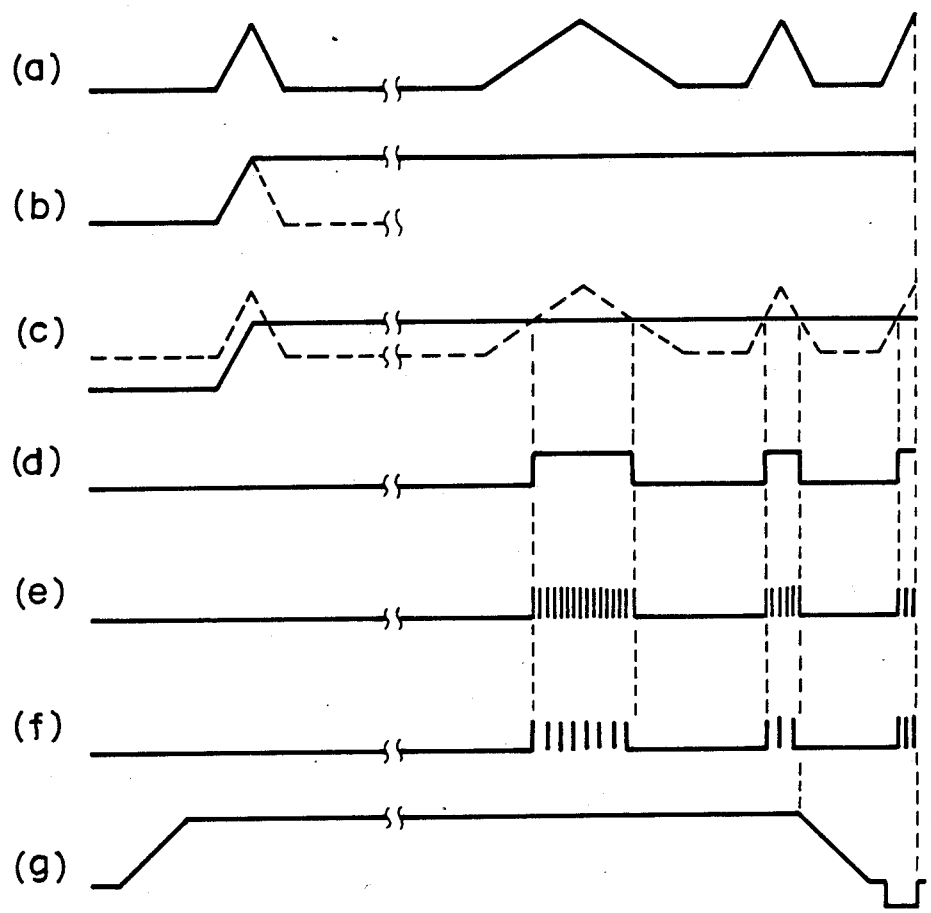
FIG. 5 is a time chart showing waveforms of signals produced at various portions of the block diagram of FIG. 3.

The manner of positioning the wafer 1 will now be described in more detail, taken in conjunction with FIGS. 1–5. Of these Figures, FIG. 5 is a time chart wherein portions (a)–(g) show changes in electric voltage which appear at points denoted in FIG. 3 by corresponding characters a–g. Hereinafter, signals at these points will be referred to as "signal a", "signal b", --- "signal g". Also, in the time chart of FIG. 5, the axis of abscissa denotes time. The axis of abscissa thus can be regarded as an axis representing the position of the wafer in the rotational direction as long as the wafer rotates at a constant speed.

First, in operation, the table 4 is moved to its inclined position and the air-bearing unit (not shown) is actuated to discharge an air pressure over the surface of the table 4. The sensor unit 9 and the pressing rollers 6 and 7 are moved inwardly to their innermost positions, respectively. After this, the wafer 1 is conveyed and placed on the table 4. At this time, under the influence of the air-bearing unit, the wafer 1 slides on the table 4 surface toward the wafer rotation guide roller 8 and the wafer driving roller 2. When the wafer 1 engages with them, the sliding movement of the wafer 1 is stopped (Step S1).

Then, the peak detecting circuit 104, the counter 105 and the up/down counter 111 are all cleared and the switch 117 is switched to its high-voltage $V_H$ side to thereby initiate higher-speed rotation of the wafer 1. At this time, in order to prevent undesired slip between the wafer 1 and the wafer driving roller 2, the actuation of the motor 115 is controlled so that it does not start and stop quickly. More particularly, a gradually increasing electric voltage is applied to the motor 115 when it starts rotation and, after elapse of a predetermined time, a constant electric voltage is applied to the motor 115. When the motor 115 is to be stopped, similarly, a gradually decreasing electric voltage is applied to the motor 115. Signal g, shown in FIG. 5, shows the manner of voltage application to the motor 115, assuring such gradual acceleration and deceleration.

As the wafer 1 rotates, the degree of interception of light, emitted from the light source 10, by the lower surface of the wafer 1 (i.e. the quantity of light received by the photosensor 101) changes due to the presence of the notch and the orientation flat. Such change in the light quantity is converted into a change in electric signal by means of the photosensor 101. Signal a in FIG. 5 shows the output signal of the photosensor 101 as having been amplified by the preamplifier 102. In this signal a, a knife-edge peak corresponds to the notch of the wafer 1, whereas a peak having gentle slopes corresponds to the orientation flat. The signal a is processed by the peak detecting circuit 104, whereby the maximum change (i.e. the peak value) is detected (Step S2).

The output pulses from the pulse generator 114 in accordance with the amount of rotation of the wafer 1 are applied to the counter 111 and counted thereby. The comparator 112 compares the count number in the counter 111 with the predetermined number set in the setting circuit 113. As described hereinbefore, such a number that is the sum of the number of the output pulses from the pulse generator 114 upon completion of one rotation of the wafer 1 plus an additional small number of pulses, has been preset in the setting circuit 113 as the preset number. Thus, when the wafer 1 rotates by an amount slightly greater than one complete rotation, the comparator 112 produces the detection signal representing completion of one rotation of the wafer 1, such that the sequencer 120 now detects the completion of one rotation of the wafer 1 (Step S3). In response thereto, the sequencer 120 clears again the counter 111.

At this time, the sequencer 120 stops the operation of the peak detecting circuit 104, whereby the detected peak value is held. Signal b in FIG. 5 is the output signal of the peak detecting circuit 104. The detected peak value is applied to the level shifter 122 and the level of the peak value is shifted down by the predetermined degree. In the portion (c) of FIG. 5, the solid line depicts the peak-value signal having been subjected to the level shifting by the level shifter 122. The level-shifted peak value will be used as a slice level in the photoelectric detection of the notch (Step S4). Upon the photoelectric detection of the notch, as will be described later in more detail, the output of the photosensor 101 is first compared with the slice level (signal c in FIG. 5), such that, in accordance with the magnitude relation therebetween, the output signal of the photosensor 101 is binarized. On the basis of the pulses obtainable as a result of such binary coding, the notch and the orientation flat of the wafer 1 can be detected. It is to be noted here that the slice level for the binary coding should be so determined that the notch and/or the orientation flat can be discriminatingly detected on the basis of the pulses obtained as a result of binary coding, regardless of the fact that the wafer diameter is not exactly regular. And, the amount of level shifting by the level shifter is determined to meet this.

If, at Step S3, it is discriminated that one rotation of the wafer 1 is not completed, the sequence goes back to Step S2 whereby detection of the peak value is continued until one complete rotation of the wafer 1 is accomplished.

The wafer 1 continues rotation and the comparator 103 compares the signal a from the photosensor 101 (depicted by a broken line in the portion c of FIG. 5) with the aforementioned slice level (signal c). The level of the output of the photosensor 101 increases beyond the slice level when the notch or the orientation flat of the wafer 1 passes through the sensor unit 9. During a time period during which the output level of the photosensor 101 is higher than the slice level, the comparator 103 produces an output signal of "high" level. Signal d in FIG. 5 depicts such output of the comparator 103. The output signal d is applied to an output of AND gate 121 and it is used to control application of the output pulses of the pulse generator 114 to the counter 105 and the up/down counter 108. More specifically, only during a time period during which the notch or the orientation flat of the wafer passes underneath the photosensor 101, the output of the comparator 103 is held in the "high" level so that the AND gate 121 is opened during such time period. As a result, the pulses are applied to the counters 105 and 108 and are counted thereby. Signal e in FIG. 5 depicts the input into the counter 105.

At this time, the switch 110 is held in the divider 109 side position and the up/down counter 108 is held in the up-counting mode. Therefore, each time two pulses are output from the pulse generator 114, the counter 108 up-counts by "1" in response thereto. Signal f in FIG. 5 depicts the input into the up/down counter 108 in this occasion. It is seen that the number of pulses in the signal f to be counted by the counter 108 is equal to the half of the number of pulses in the signal e.

The comparator 106 compares the content of the counter 105 and the upper limit value and the lower limit value which are preset in the setting circuit 107. The upper limit corresponds to the sum of the number of pulses to be applied to the counter 105 in response to passage of the notch underneath the photosensor 101 and a predetermined number, while the lower limit corresponds to the remainder when a predetermined number is subtracted from the aforesaid pulse number.

After the notch or the orientation flat passes underneath the photosensor 101, the AND gate 121 is closed. If, at the time, the content of the counter 105 is between the upper and lower limits set in the setting circuit 107, it is discriminated in the comparator 106 that the wafer edge just having been subjected to the photoelectric detection has the notch. And, the comparator 106 produces a detection signal representing detection of the notch, the signal being applied to the sequencer 120. By this, the sequencer 120 detects the notch (Step S5). If the comparator 112 produces a detection signal representing completion of one rotation of the wafer, before the notch is detected, it means that detection of the notch ends in failure in spite of one complete rotation of the wafer. Accordingly, the sequence goes back to Step S2. In such occasion, the slice level which has already been established may be used. If it is used, Steps S2–S4 for determining the slice level are no longer necessary. Therefore, the notch detecting operation at Step S5 is simply repeated.

When the notch of the wafer is detected at Step S5, the sequencer 120 stops the motor 115 with gradual deceleration such as shown at g in FIG. 5, thereby to stop the rotation of the wafer. Then, the switch 117 is changed to its low-voltage $V_L$ side so as to reversely rotate the motor 115 at a lower speed. That is, an electric voltage of opposite polarity is applied to the motor 115, such as shown at the right-hand end portion of the signal g in FIG. 5. During this reverse rotation, the photosensor 101 detects the trailing edge of the notch (i.e. the leading edge of the notch with respect to the direction of the reverse rotation of the wafer). At this time, the switch 110 is so positioned that the output pulses from the pulse generator 114 are applied directly to the up/down counter 108, and the up/down counter 108 is in the down-counting mode. Also, at this time, the up/down counter 108 holds such a value that is equal to the half of the number of pulses having been generated in response to the passage of the notch through the sensor unit 9. Accordingly, at the time of detection of the trailing edge (the leading edge in the reverse rotation) of the notch, the up/down counter 108 starts down-counting with the output pulses of the pulse generator. When the content of the up/down counter 108 becomes zero and the carry signal is produced, the motor 115 is stopped. By this, the center of the notch is positioned exactly under the photosensor 101, i.e. at the position to be engaged by the pressing pin 11 at a later stage (Step S6).

The positioning of the notch of the wafer is accomplished in the manner described hereinbefore. If desired, mechanically pressing operation may be effected to achieve θ-positioning (positioning in rotational direction) and centering at higher accuracy.

Such mechanically pressing operation will be described. First, after completion of the positioning of the notch described above, the wafer 1 is attracted to and fixedly held on the table 4 by vacuum suction generated by the air-bearing unit. Then, the sensor unit 9 and the pressing rollers 6 and 7 are moved outwardly. This is to prevent possible interference of these members against movement of the table 4 to its horizontal position. Thus, while holding the unit 9 and the rollers 6 and 7 at their outermost positions, the table 4 is pivotally moved to the horizontal position. After this, by moving the unit 9 inwardly, the pressing pin 11 which is mounted on the lower portion of the unit 9 is first introduced into the notch of the wafer. After completion of the introduction of the pin 11, the air is flown again over the table 4 surface to float the wafer 1. Then, the pressing rollers 6 and 7 are pressed against the wafer 1, whereby the θ-positioning and the centering of the wafer 1 are accomplished. FIGS. 2D and 2E show such pressing operation.

Subsequently, the wafer 1 is attracted and fixedly held on the table 4 by vacuum suction and, thereafter, the pressing pin 11 and the pressing rollers 6 and 7 are moved outwardly so that they disengage from the wafer 1 (Step S7).

By this, the positioning of the wafer 1 is finished. And, the wafer 1 is conveyed to a wafer loading station in an exposure apparatus, an examining apparatus or the like, with the accuracy of positioning being maintained (Step S8).

In the present embodiment, as described hereinbefore, the slice level for the photoelectric detection is determined on the basis of the peak value of the output of the photosensor during one complete rotation of the wafer, and the output of the photosensor is binarized by the comparison with the slice level. This stably assures correct detection of the notch and/or the orientation flat even for such wafers whose external diameters are not exactly the same.

Also, discrimination of the notch and the orientation flat from each other is made by, first, counting the width of the pulse, which is obtainable as a result of binarization, using output pulses from the pulse generator 114 rotating in association with the wafer driving roller 2 and, second, by comparing the result of counting with a preset value. Since the result of counting is constant regardless of the speed of rotation of the wafer, each of the notch and the orientation flat can be independently and accurately detected.

More particularly, where such a value that corresponds to the result of counting of the pulse width related to the orientation flat is set in the setting circuit as the aforesaid preset value, the orientation flat can be easily and accurately detected independently of the notch.

In the present embodiment, higher-speed rotation of the wafer continues until the notch (or the orientation flat, as desired) thereof is detected. If it is detected, the rotation of the wafer is decelerated and then stopped. Thereafter, the wafer is rotated in the reverse direction at a lower speed and, at the time at which trailing edge of the notch (the leading edge of the notch with respect to the reverse rotation of the wafer) is detected, counting of the pulses from the pulse encoder is initiated. When a predetermined number of pulses are counted, the rotation of the wafer is stopped, whereby the center of the notch is accurately positioned in place. Thus, the positioning of the wafer can be accomplished in a reduced time and, in addition thereto, any slip which might occur between the wafer and the wafer driving roller at the time of deceleration from the high-speed rotation, would not effect upon the accuracy of the positioning.

Referring now to FIGS. 6–10, a positioning device according to another embodiment of the present invention will be described. The device of the present embodiment is similar to that of the foregoing embodiment, and major distinction lies in the structure and function of the control system. Therefore, description will now be made to the essence of the control system.

FIG. 6 is a block diagram showing the control system of the device of the present embodiment. Upon the photoelectric detection of the notch of the wafer, the wafer is first rotated. During such rotation, the output of the photosensor 101 which is produced in accordance with the light incident thereon, is amplified by a preamplifier 102. Thus, the change in the quantity of light as detected by the photosensor 101 is converted into a change in the electric voltage. The signals outputted from the preamplifier 102 is supplied to an inclination detecting circuit 204. The inclination detecting circuit 204 is adapted to detect the inclination of change in the signal with respect to time thereby to detect the notch. The output of the photosensor 101 corresponding to the position of the edge of the wafer 1, just after the notch of the wafer completely passes underneath the photosensor 101, is applied to a level shifter 122 by which the level of the output signal of the circuit 204 is shifted by a preset value. The signal having been subjected to the level shifting is applied to an input terminal of a comparator 103. The comparator 103 has another input terminal to which the output signal from the preamplifier 102 is directly input. Thus, the comparator 103 compares two input signals and produces an output signal which corresponds to the difference in level of the two signals applied to the comparator. The function of the level shifter 122 will be described later in more detail.

The motor 115 produces a driving force for rotating the wafer driving roller 2, and, in the present embodiment, the direction and speed of rotation of the motor 115 (i.e. the direction and speed of rotation of the wafer) can be changed in three phases, i.e. a phase for higher speed forward rotation, a phase for lower speed forward rotation and a phase for lower speed reverse rotation. Changing the phase of operation of the motor 115 is effected by means of a switch 117. The rotation of the output shaft of the motor 115 is transmitted to the pulse generator 114, so that it produces pulses in accordance with the rotation of the wafer 1.

An up/down counter 108 is provided to detect the position of the center of the notch with respect to the peripheral direction of the wafer. The same pulses as those to be applied to a counter 105 (described later) are applied to this up/down counter 108. More particularly, a half frequency divider 109 and switch means such as at 110 are provided. And, under the influence of the switch 110, the pulses are applied directly to the counter 108 in an occasion or those having been processed by the frequency divider 109 are applied to the counter 108 in another occasion. Also, the switching signal for the switch 110 is effective to change the counting mode of the up/down counter 108, i.e. establishing the up-counting mode or the down-counting mode. Namely, in the up-counting mode, the counter 108 counts the pulses applied thereto by way of the divider 109, while in the down-counting mode it counts the pulses directly applied thereto. As will be described later, this is for the purpose of positioning the center of the notch. The up/down counter 108 produces, in its down-counting mode, a carry signal when it counts zero.

A counter 111 is provided to detect one complete rotation of the wafer 1. The counter 111 counts the output pulses from the pulse generator 114. A setting circuit 113 is provided. In this setting circuit 113, such a value that is slightly greater than the number of pulses which are output from the pulse generator 114 in response to one complete rotation of the wafer 1, is preset. A comparator 112 compares the result of counting by the counter 111 with the set value in the saving circuit 113. If the number of pulses as counted by the counter 111 is not less than the preset value, the comprator 112 produces a detection signal representing completion of one rotation of the wafer 1.

Sequencer 120 is provided to control the system as a whole.

The manner of positioning the wafer 1 will now be described in more detail, taken in conjunction with FIGS. 6–8. Of these Figures, FIG. 8 is a time chart wherein portions (a)–(h) show changes in electric voltage which appear at points denoted in FIG. 3 by corresponding characters a–h. Hereinafter, signals at these points will be referred to as "signal a, "signal b", --- "signal h". Also, in the time chart of FIG. 8, the axis of abscissa denotes time. The axis of abscissa thus can be regarded as an axis representing the position of the wafer in the rotational direction as long as the wafer rotates at a constant speed.

First, in operation, the table 4 is moved to its inclined position and the air-bearing unit (not shown) is actuated to discharge an air pressure over the surface of the table 4. The sensor unit 9 and the pressing rollers 6 and 7 are moved inwardly to their innermost positions, respectively. After this, the wafer 1 is conveyed and placed on the table 4. At this time, under the influence of the air-bearing unit, the wafer 1 slides on the table 4 surface toward the wafer rotation guide roller 8 and the wafer driving roller 2. When the wafer 1 engages with them, the sliding movement of the wafer 1 is stopped (Step S1).

Then, the inclination detecting circuit 204, the counter 105 and the up/down counter 111 are all cleared and the switch 117 is switched to its high-voltage $V_H$ side to thereby initiate higher-speed rotation of the wafer 1 (Step S2). At this time, in order to prevent undesired slip between the wafer 1 and the wafer driving roller 2, the actuation of the motor 115 is controlled so that it does not start and stop quickly. More particularly, a gradually increasing electric voltage is applied to the motor 15 when it starts rotation and, after elapse of a predetermined time, a constant electric voltage is applied to the motor 115. When the motor 115 is to be stopped, similarly, a gradually decreasing electric voltage is applied to the motor 115. Signal h in FIG. 8 shows the manner of voltage application to the motor 115, assuring such gradual acceleration and deceleration.

As the wafer 1 rotates, the degree of interception of light, emitted from the light source 10, by the lower surface of the wafer 1 (i.e. the quantity of light received by the photosensor 101)changes due to the presence of the notch and the orientation flat. Such change in the light quantity is converted into a change in electric signal by means of the photosensor 101. Signal a in FIG. 8 shows the output signal of the photosensor 101 as having been amplified by the preamplifier 102. In this signal a, a knife edge peak corresponds to the notch of the wafer 1, whereas a peak having gentle slopes corresponds to the orientation flat.

The signal a is inputted into the inclination detecting circuit 204, whereby the rate of change (inclination) of the signal with respect to time is detected. The value concerning the inclination, thus detected, is compared with a predetected value concerning the inclination of the change in the quantity of light to be sensed by the photosensor in response to the passage of the notch through the photosensor unit 9. On the basis of this comparison, the notch can be detected (Step S3). That is, when these values are equal to each other, a notch detection signal such as shown at (b) of FIG. 8 is applied to the sequencer 120. Details of the structure and operation of the inclination detecting circuit 204 will be described later.

The output pulses from the pulse generator 114 in accordance with the amount of rotation of the wafer 1 are applied to the counter 111 and counted thereby. The comparator 112 compares the count number in the counter 111 with the predetermined number set in the setting circuit 113. As described hereinbefore, such a number that is the sum of the number of the pulses which are to be outputted from the pulse generator 114 upon completion of one rotation of the wafer 1 plus an additional small number of pulses, has been preset in the setting circuit 113 as the preset number. Thus, when the wafer 1 rotates by an amount slightly greater than one complete rotation, the comparator 112 produces the detection signal representing completion of one rotation of the wafer 1, such that the sequencer 120 now detects the completion of one rotation of the wafer 1 (Step S4).

If no notch is detected until completion of one rotation of the wafer 1, the photoelectric detection ends in failure so that the sequence goes back to Step S2 to repeat the notch detection. If the notch is still undetectable, the positioning operation is stopped and an error signal is produced (although not shown in the flow chart of FIG. 7).

When the notch passes over the photosensor 101 and the notch detection signal is supplied into the sequencer 120, the sequencer 120 operates to energize the motor 115 after the notch completely passes the photosensor 101 position, thereby to stop the rotation of the wafer. Then, the inclination detecting circuit 204 operates to read the photosensor 101 output which corresponds to the wafer edge position defined when the wafer rotation is stopped. The thus read output level of the photosensor is held by the inclination detecting circuit. The thus held signal is such as illustrated at (c) of FIG. 8, and it is applied to the level shifter 122. By this level shifter 122, the voltage level of the signal c is shifted upwardly in this embodiment by a preset amount which, in this embodiment, corresponds to the half of the height (depth) of the notch, whereby a signal d shown in FIG. 8 is produced. The signal d is used in a later stage (Step S5) as the slice level for the purpose of detection of the center of the notch.

Once the slice level is determined, the switch 117 is changed to a lower voltage $V_{L1}$ positioned so as to rotate the motor 115 and thus the wafer 1 in a reverse direction and at a lower speed. Namely, an electric voltage of opposite polarity is supplied to the motor 115, such as shown at (h) of FIG. 8. By this reverse rotation, the trailing edge of the notch (i.e. the leading edge of the notch with respect to the reverse rotation) is detected.

Then the comparator 103 compares the signal a from the photosensor 101 (depicted by a broken line in the portion d of FIG. 8) with the aforementioned slice level (signal d). The level of the output of the photosensor 101 increases beyond the slice level when the notch or the orientation flat of the wafer 1 passes through the sensor unit 9. During a time period during which the output level of the photosensor 101 is higher than the slice level, the comparator 103 produces an output signal of "high" level. Signal e in FIG. 8 depicts such output of the comparator 103. The output signal e is applied to the AND gate 121 and it is used to control application of the output pulses of the pulse generator 114 to the counter 105 and the up/down counter 108. More specifically, only during a time period during which the notch or the orietation flat of the wafer passes underneath the photosensor 101, the output of the comparator 103 is held in the "high" level so that the AND gate 121 is opened during such time period. As a result, the pulses are applied to the counters 105 and 108 and are counted thereby. Signal f in FIG. 8 depicts the input into the counter 105.

At this time, the switch 110 is held in the divider 109 side position and the up/down counter 108 is held in the up-counting mode. Therefore, each time two pulses are outputted from the pulse generator 114, the counter 108 up-counts by "1" in response thereto. Signal g in FIG. 8 depicts the input into the up/down counter 108 in this occasion. It is seen that the number of pulses in the signal g to be counted by the counter 108 is equal to the half of the number of pulses in the signal f.

A comparator 106 compares the content of the counter 105 and an upper limit value and a lower limit value which are preset in a setting circuit 107. The upper limit corresponds to the sum of the number of pulses to be applied to the counter 105 in response to passage of the notch underneath the photosensor 101 and a predetermined number, while the lower limit corresponds to the remainder when a predetermined number is subtracted from the aforesaid pulse number. By the comparison in the comparator 106, whether the detection of the notch with the inclination detecting circuit 204 is correct or not can be discriminated.

When the notch of the wafer is detected at Step S6, the sequencer 120 stops the motor 115 thereby stopping the rotation of the wafer. Then, the switch 117 is changed to its low-voltage $V_{L2}$ side so as to rotate forwardly, again, the motor 115 at a lower speed. That is, an electric voltage of opposite polarity to that in the reverse rotation is applied to the motor 115, such as shown at the right-hand end portion of the signal h in FIG. 8. During this second forward rotation, the photosensor 101 detects the leading edge of the notch. At this time, the switch 110 is so positioned that the output pulses from the pulse generator 114 are applied directly to the up/down counter 108, and the up/down counter 108 is in the down-counting mode. Also, at this time, the up/down counter 108 holds such a value that is equal to the half of the number of pulses having been generated in response to the passage of the notch through the sensor unit 9. Accordingly, at the time of detection of the leading edge of the notch, the up/down counter 108 starts down-counting with the output pulses of the pulse generator. When the content of the up/down counter 108 becomes zero and the carry signal is produced, the motor 115 is stopped. By this, the center of the notch is positioned exactly under the photosensor 101, and thus whose position is detected (Step S7).

The positioning of the notch of the wafer is accomplished in the manner described hereinbefore. If desired, mechanically pressing operation may be effected (Step S8) to achieve $\theta$-positioning (positioning in rotational direction) and centering at higher accuracy, in a similar manner described hereinbefore.

After completion of the positioning by the device of the present embodiment, the wafer is conveyed to a wafer loading station defined in an exposure apparatus, an examining apparatus or the like, with the accuracy of positioning being maintained (Step S9).

Figure 8:
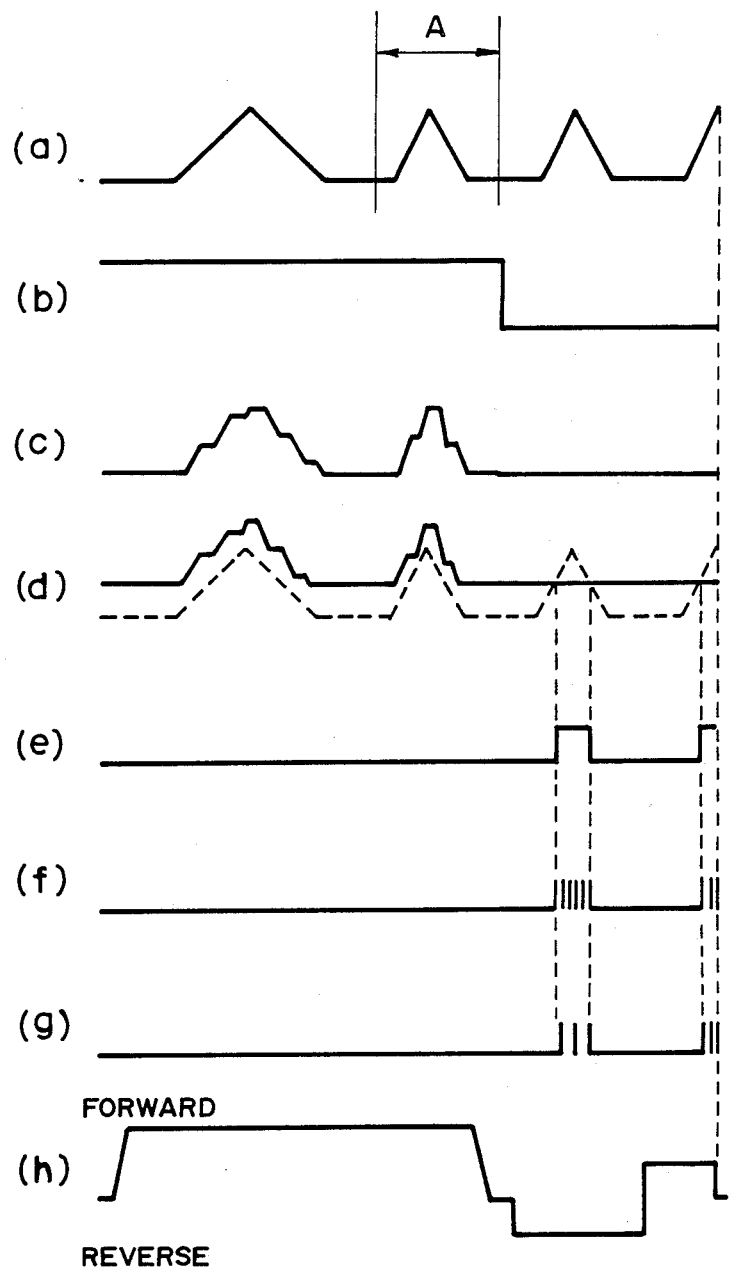
FIG. 8 is a time chart showing waveforms of signals produced at various portions in the block diagram of FIG. 6.
Figure 9:
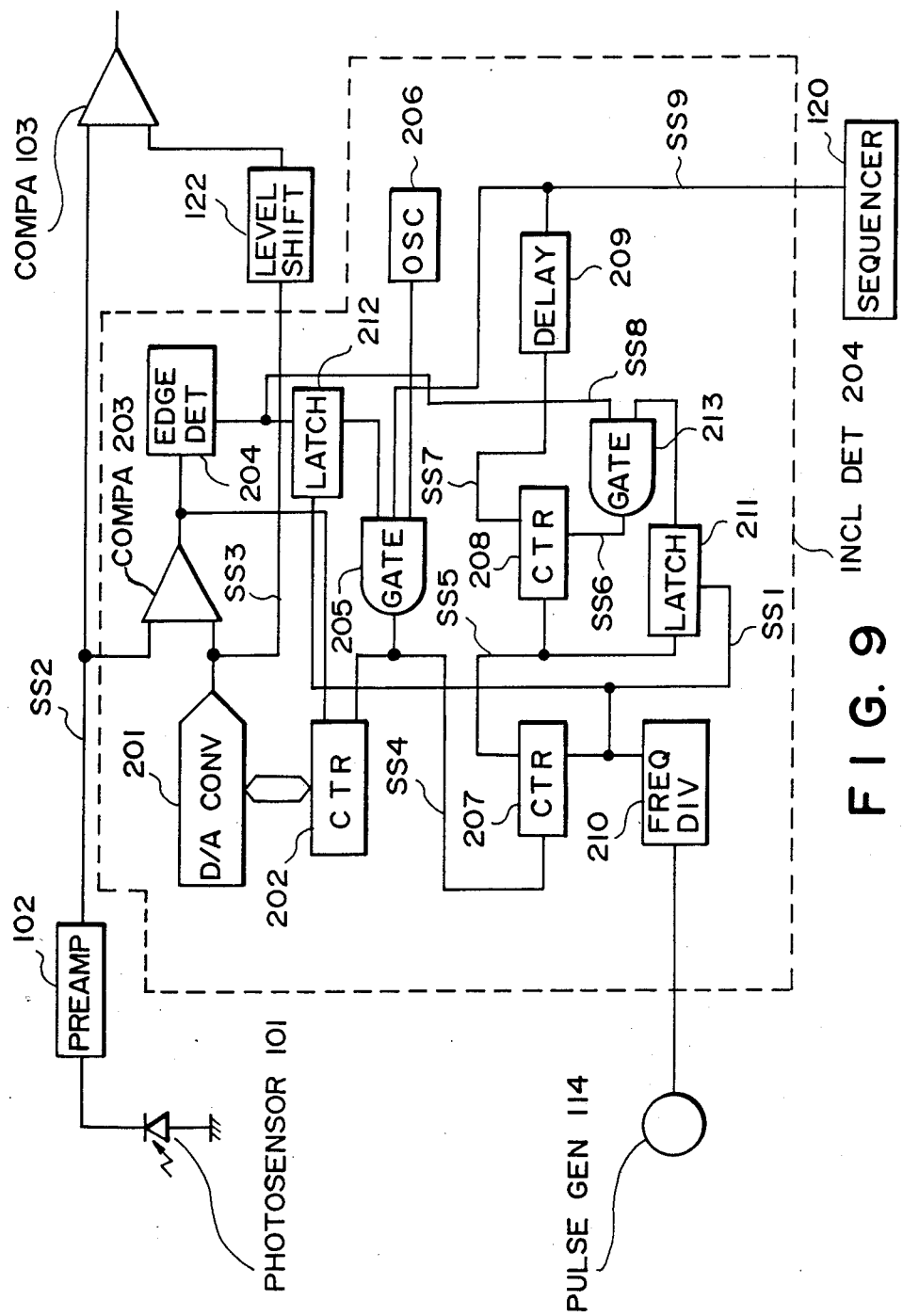
FIG. 9 is a block diagram showing details of an inclination detecting circuit of the control system shown in FIG. 6.
Figure 10:
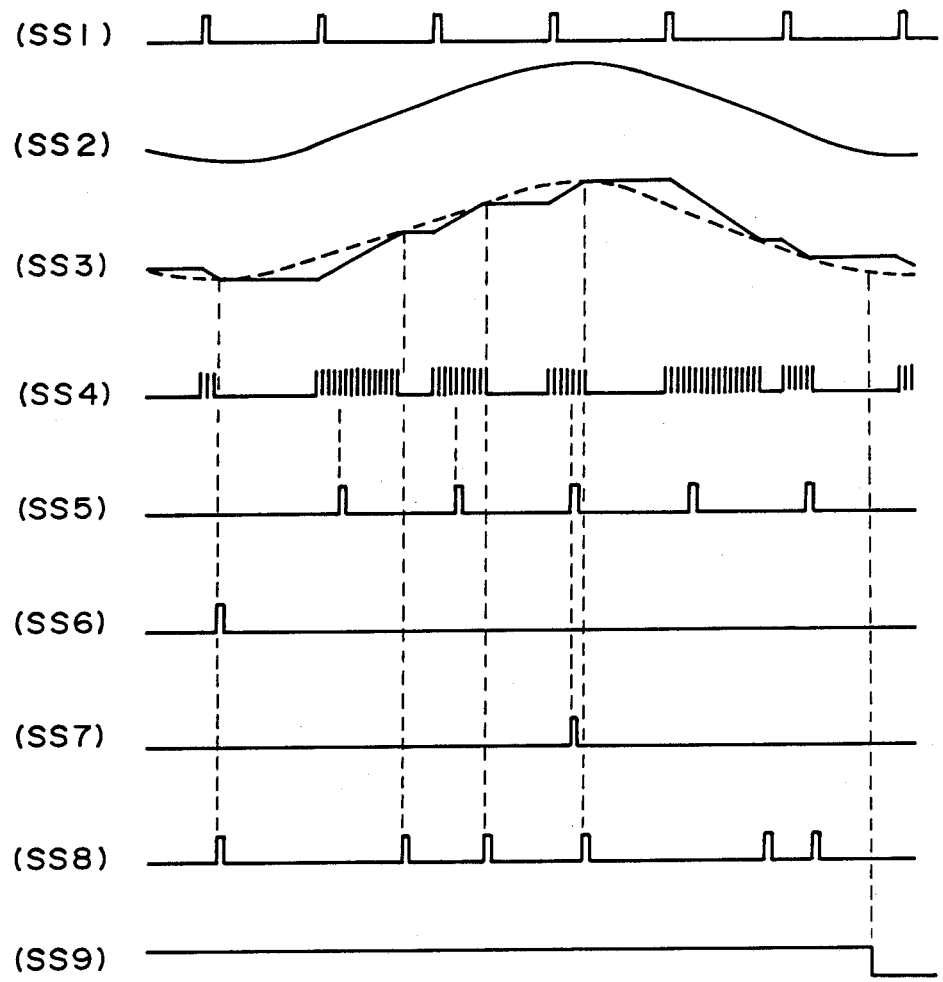
FIG. 10 is a time chart showing waveforms of signals produced at various portions of the block diagram of FIG. 9.

The structure and operation of the inclination detecting circuit 104 will now be described, taken in conjunction with FIGS. 9 and 10. Of these Figures, FIG. 9 is a block diagram showing the details of the inclination detecting circuit denoted at 204 in FIG. 6, while FIG. 10 is a time chart showing details of such portion of the signal a in FIG. 8 that is denoted by character A. In FIG. 10, characters SS1–SS9 denote changes in electric voltages which appear at corresponding points in the diagram of FIG. 11. Hereinafter, these output voltages will be referred to as "signal SS1", "signal SS2", --- "signalG SS9".

The signal of the photosensor 101 as output from the preamplifier 102 is applied to an analog-to-digital converter system (hereinafter "A/D converter system") comprising a digital-to-analog converter (hereinafter "D/A converter") 201, a counter 202, a comparator 203, a gate 205 and an oscillator 206. The oscillator 206 produces clock signals which are applied to a clock-signal counting input terminal of the counter 202 by way of the gate 205. The output of the counter 202 is supplied to a digital input terminal of the D/A converter 201. Thus, up-counting or down-counting by the counter 202 causes an increase or a decrease in the level of the output signal (signal SS3) of the D/A converter 201. This signal SS3 and the output signal SS2 of the preamplifier 102 are compared with each other by the comparator 203. If the result of comparison shows "SS2>SS3", the comparator 203 produces an "up signal" which is applied to the counter 202. If, on the other hand, the result of comparison shows "SS2<SS3", the comparator 203 outputs a "down signal" to the counter 202. In this manner, the signal SS3 is changeable so as to follow or trace the change in the signal SS2. The A/D converter system of the type described above is known as a "servo-balancing type A/D converter system".

When the gate 205 opens, the clock pulses from the oscillator 206 are supplied to the counter 202 (signal SS4). By this, the output signal SS3 of the D/A converter 201 changes. When the level of the signal SS3 becomes equal to or substantially equal to that of the signal SS2, the output of the comparator 203 changes from the "high" level to the "low" level or, alternatively, from the "low" level to the "high" level. This change is detected by an edge detector 204 and, in response thereto, the gate 205 closes. By this, the output of the D/A converter 201 is held at the value established at the time when the gate 205 is closed (signal SS3).

A signal for opening the gate 205 is produced by clearing a latch 212 by use of pulses obtained by subjecting the pulses of the pulse generator 114 to the frequency division by a frequency divider 210. Namely, one clear signal (each pulse in signal SS1) is output each time a constant length of the outer periphery of the wafer passes underneath the photosensor 101. Also, the signal SS1 (more particularly, each pulse therein) is effective to clear the counter 207 and the latch 211 simultaneously.

When the gate 205 opens in response to the signal SS1, the pulses (in signal SS4) are output until the levels of the signals SS2 and SS3 become equal to each other. If the signal SS2 changes by a great amount after the gate 205 is closed and before it is opened subsequently, the number of pulses output until the signals SS2 and SS3 reach the same level increases. In other words, such a number of pulses (signal SS4) that is proportional to the amount of change in the output (signal SS2) of the preamplifier, during the interval between two adjacent clear signals (SS1), are produced. Thus, by counting the pulses (SS4), the inclination of the signal SS2, i.e. the change in the wafer edge position during rotation of the wafer by a constant circumferential distance, can be detected. The wafer edge position changes more quickly with respect to the notch than with respect to the orientation flat and, therefore, the inclination of the signal SS2 corresponding to the notch is greater. As a result, when the notch passes underneath the photosensor 101, the number of pulses SS4 increases. For example, five pulses SS4 are outputted for the orientation flat, whereas ten pulses are outputted for the notch. In such case, a number "7" is set, for example, as the reference for the number of pulses, and discrimination is made in such manner that it is the orientation flat where the number of output pulses is less than "7" while, on the other hand, it is the notch where the number of output pulses is not less than "7". This discrimination is achieved by the counter 207. More particularly, in the present embodiment, the counter 207 is so arranged that, when seven (7) pulses of signal SS4 are applied to the counter 207, it produces one "high level" output pulse (in signal SS5). Thus, each time one pulse in the signal SS5 is output from the counter 207, it is discriminated that the notch is passing. The signal SS5 is applied to each of the counter 208 and the latch 211. In summary, the function of the counter 208 and the latch 211 is that they cooperate to produce a signal representing attainment of detection of the notch only when a predetermined number of signals (pulses) SS5, e.g. three, are output in series from the counter 207. This effectively improves the reliability of the notch detection. Namely, there is possibility, though it is very low, that any scratch or other minute damage on the outer periphery of the wafer results in generation of a pulse (in signal SS5). If, therefore, the detection of the notch relies upon output of only a single pulse from the counter 207, it is possible that such scratch or damage is detected as a "notch". To the contrary, when the notch is ,actually detected, a series of pulses SS5 are always the output. Thus, if, for example, three pulses are output in series, it can be discriminated with certainty that the notch is detected.

The notch detecting operation will now be described in more detail. First, the latch 211 is cleared each time a pulse of the signal SS1 is applied thereto. The output of the latch 211, at that time, is so made as to open the gate 213. When the signal (pulse) SS5 is output from the counter 207, the latch 211 is set and the gate 213 is closed. To this gate 213, a pulse of the signal SS8, produced by the edge detecting circuit 204 in response to congruity of the signals SS2 and SS3, has been supplied. That is, since the signal SS5 is not output where the notch is not detected, the counter 208 is cleared each time the analog-to-digital conversion is completed. When, however, the notch is detected and a pulse of the signal SS5 is output, the counter 208 is incremented and, at the same time, the latch 211 is set. Accordingly, the gate 213, is closed. As a result, the counter 208 is no longer cleared by the signal SS8 from the edge detecting circuit 204. Thus, the content of the counter 208 is held. When further pulses SS5 are output, the counter 208 up-counts so that the content thereof becomes "2". It will be readily understood therefrom that, by monitoring the signal SS7 whose level becomes "high" when the counter 208 counts "3", whether or not three pulses (SS5) each representing detection of the notch are output in series can be discriminated. The signal SS7 is applied to a delay 209 which is arranged to hold the same until the notch completely passes underneath the photosensor 101. Thus, after elapse of predetermined time delay, a signal SS9 is output from the delay 209 which is supplied to the gate 205 to close the same. By this, the photosensor 101 output corresponding to the position of the wafer edge at this time can be held. Also, the signal SS9 is supplied to the sequencer 120 as a notch detection signal.

In accordance with the present embodiment, as has hitherto been described, the passage of the notch and/or the orientation flat through the photodetecting unit can be detected on the basis of the inclination of change, with respect to time, in the photosensor 101 output corresponding to the rotating wafer edge position. Also, the slice level is determined on the basis of the wafer edge position which is adjacent to the notch (in the case of notch detection), and the output of the photosensor 101 is binary coded in accordance with the thus determined slice level. This stably assures correct detection of the notch, for each of wafers whose outer diameters are not exactly the same.

Figure 11:
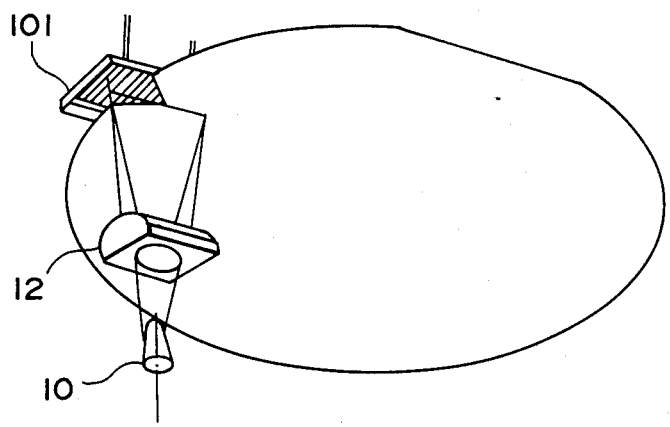
FIG. 11 is a perspective view schematically showing a wafer edge detecting system of a positioning device according to a third embodiment of the present invention.

The wafer is rotated at a higher speed until its notch is detected. When the notch is detected, the wafer rotation is decelerated and stopped. Then, the wafer is rotated in the reverse direction and at a lower speed, and the number of pulses from the pulse generator is counted only during the time period from detection of the trailing edge (leading edge with respect to the reverse rotation) of the notch and to detection of the leading edge (trailing edge with respect to the reverse rotation) of the notch. After the reverse rotation is stopped, the wafer is rotated forward by an amount which corresponds to the half of the counted pulse number, whereby the center of the notch is positioned with respect to the photosensor. Thus, the positioning of the wafer can be accomplished in a reduced time. Moreover, any slip which might occur between the wafer and the wafer driving roller at the time of deceleration of the higher-speed wafer rotation, does not effect the accuracy of the positioning. Further, in the present embodiment, the light emitted from the light source 10 to irradiate the wafer is concentrated or shaped by the condensing lens system 12 so that it has an elongated shape in cross-section which elongates substantially in the radial direction of the wafer. By use of such elongated light, the change in the wafer edge position can be precisely detected and, whereby, high-accuracy positioning of the wafer is attainable.

Where a cylindrical lens system is used as the condensing lens system 12, the light from the light source 10 can be easily shaped into the elongated shape in cross-section. FIG. 11 shows a wafer edge detecting system of the positioning device using such cylindrical lens system as the condensing lens system 12.

In the present embodiment, a photodetector is used as the photosensor 101 for detecting the changes in the wafer edge position. The use of photodetector is, however, not indispensable, and other suitable means such as a photoarray of charge-coupled devices may be used. Also, a pulse motor may be used as the motor 115. If such pulse motor is used, the use of the pulse encoder 114 is not necessary.

While the invention has been described with reference to the structures disclosed herein, it is not confined to the details set forth and this application is intended to cover such modifications or changes as many come within the purposes of the improvements or the scope of the following claims.

What is claimed is:

1. A device for detecting a cut formed at a peripheral edge of a wafer, comprising:
   means for rotating the wafer;
   sensing means having a sensing region and being disposed so that a portion of the edge of the wafer is positioned within said sensing region, said sensing means providing an output signal corresponding to the position of the edge of the wafer in said sensing region, said output signal varying with changes in the position of the edge of the wafer in said sensing region of said sensing means due to the rotation of said wafer by said rotating means; and
   means for discriminating between first and second cuts formed on the peripheral edge of the wafer, the first cut being different from the second cut, said discriminating means including means for detecting the rate of change with respect to time of the variations in the output signal of said sensing means, said discriminating means further including means for comparing the detected rate of change with respect to time of the variations in the output signal of the sensing means with a predetermined reference for discriminating between the first cut and the second cut formed on the peripheral edge of the wafer.

2. A device for positioning a wafer having a cut formed at a peripheral edge thereof, comprising:
   means for rotating the wafer;
   sensing means having a sensing region and being disposed so that portion of the edge of the wafer is positioned within said sensing region, said sensing means providing an output signal corresponding to the position of the edge of the wafer in said sensing region, said output signal varying with changes in position of the edge of the wafer in said sensing region of said sensing means due to the rotation of said wafer by said rotation means;
   means for discriminating between first and second cuts formed on the peripheral edge of the wafer, the first cut being different from the second cut, said discriminating means including means for detecting the rate of change with respect to time of the variations in the output signal of said sensing means, said discriminating means further including means for comparing the detected rate of change with respect to time of the variations in the output signal of said sensing means with a predetermined reference for discriminating between the first cut and the second cut formed on the peripheral edge of the wafer;
   means for binary-coding the output signal of said sensing means after the passage of at least one of the first and second cuts of the wafer through said sensing region of said sensing means is determined; and
   control means for controlling the rotational movement of the wafer on the basis of the binary-coded signal.

3. A device for detecting a cut formed at a peripheral edge of a wafer, comprising:
   rotating means for rotating the wafer;
   sensing means having a sensing region and being disposed so that a portion of the edge of the wafer is positioned within said sensing region, said sensing means providing an output signal corresponding to the position of the edge of the wafer in said sensing region, said output signal varying with changes in the position of the edge of the wafer in said sensing region of said sensing means due to the rotation of the wafer by said rotating means; and
   means for discriminating between first and second cuts formed on the peripheral edge of the wafer, the first cut being different from the second cut, said discriminating means including means for binary-coding the output signal of said sensing means to provide a pulse signal, said discriminating means further including means for comparing the width of the pulse signal provided by said binary-coding means with the predetermined reference for discriminating between the first cut and the second cut formed on the peripheral edge of the wafer.

4. A device for detecting a cut formed at a peripheral edge of a wafer, comprising:
   rotating means for rotating the wafer;
   sensing means having a sensing region and being disposed so that a portion of the edge of the wafer is positioned within said sensing region, said sensing means providing an output signal corresponding to the position of the edge of the wafer in said sensing region, said output signal varying with changes in the position of the edge of the wafer in said sensing region of said sensing means due to the rotation of the wafer by said rotating means;
   means for discriminating between first and second cuts formed on the peripheral edge of the wafer, the first cut being different from the second cut, said discrimating means including means for binary-coding the output signal of said sensing means to provide a pulse signal, said discriminating means further including means for comparing the width of the pulse signal provided by said binary-coding means with a predetermined reference for discriminating between the first cut and the second cut formed on the peripheral edge of the wafer; and
   control means for controlling the rotational movement of the wafer on the basis of the width of the pulse signal provided by said binary-coding means.

* * * * *

UNITED STATES PATENT AND TRADEMARK OFFICE
CERTIFICATE OF CORRECTION

PATENT NO. : 4,853,880
DATED : August 1, 1989
INVENTOR(S) : TAKAHIRO AKAMATSU, ET AL.

It is certified that error appears in the above-identified patent and that said Letters Patent is hereby corrected as shown below:

IN [54] TITLE

"SEMI-CONDUCTOR" should read --SEMICONDUCTOR--.

SHEET 7 OF 11

Figure 7:
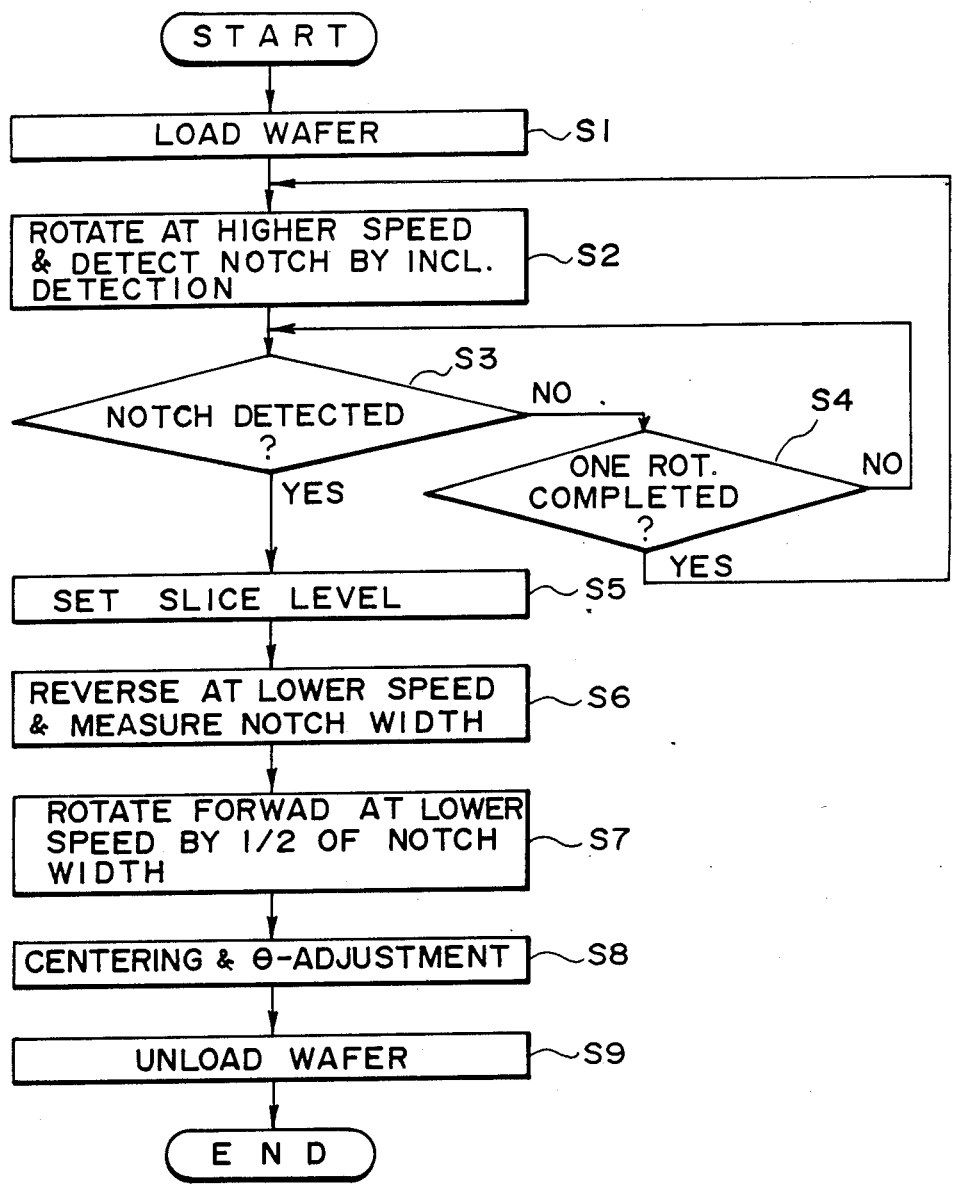
FIG. 7 is a flow chart showing an operational sequence of the positioning device according to the second embodiment of the present invention.

FIG. 7, "FORWAD" should read --FORWARD--.

COLUMN 1

Line 3, "SEMI-CONDUCTOR" should read --SEMICONDUCTOR--.
Line 38, ""Wafter" should read --"Wafer--.

COLUMN 2

Line 33, "shows" should read --show--.

COLUMN 4

Line 31, "six hundreds (600)" should read
--six hundred (600)--.

COLUMN 5

Line 56, "comprator 112" should read --comparator 112--.

COLUMN 7

Line 39, "output" (second occurrence) should read
--input--.

UNITED STATES PATENT AND TRADEMARK OFFICE
CERTIFICATE OF CORRECTION

PATENT NO. : 4,853,880
DATED : August 1, 1989
INVENTOR(S) : TAKAHIRO AKAMATSU, ET AL.

It is certified that error appears in the above-identified patent and that said Letters Patent is hereby corrected as shown below:

COLUMN 10

Line 7, "signals" should read --signal--.

COLUMN 11

Line 1, "saving circuit" should read
        --setting circuit--.
    Line 3, "comprator 112" should read --comparator 112--.
    Line 41, "motor 15" should read --motor 115--.
    Line 58, "knife edge" should read --knife-edge--.

COLUMN 13

Line 5, "orietation flat" should read
        --orientation flat--.

COLUMN 14

Line 2, "circuit 104" should read --circuit 204--.
    Line 12, ""signalG SS9"" should read --"signal SS9"--.

COLUMN 15

Line 40, ",actually" should read --actually--.
    Line 60, "gate 213," should read --gate 213--.

COLUMN 16

Line 68, "many" should read --may--.

UNITED STATES PATENT AND TRADEMARK OFFICE
CERTIFICATE OF CORRECTION

PATENT NO. : 4,853,880

DATED : August 1, 1989

INVENTOR(S) : TAKAHIRO AKAMATSU, ET AL.

It is certified that error appears in the above-identified patent and that said Letters Patent is hereby corrected as shown below:

COLUMN 18

Line 45, "discrimating" should read --discriminating--.

Signed and Sealed this

Ninth Day of July, 1991

Attest:

HARRY F. MANBECK. JR.

Attesting Officer

Commissioner of Patents and Trademarks